United States Patent
Aoki et al.

(10) Patent No.: US 8,349,698 B2
(45) Date of Patent: Jan. 8, 2013

(54) INTEGRATED SEMICONDUCTOR DEVICE AND METHOD OF MANUFACTURING THE SAME

(75) Inventors: Hironori Aoki, Niiza (JP); Eiichi Kikkawa, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 200 days.

(21) Appl. No.: 12/695,354

(22) Filed: Jan. 28, 2010

(65) Prior Publication Data

US 2010/0244183 A1    Sep. 30, 2010

(30) Foreign Application Priority Data

Mar. 31, 2009   (JP) .................................. 2009-087476

(51) Int. Cl.
    *H01L 21/76* (2006.01)
(52) U.S. Cl. ... 438/423; 438/542; 438/558; 257/E29.02; 257/E21.545
(58) Field of Classification Search ................... 257/506, 257/E29.02, E21.545; 438/423, 542, 558
    See application file for complete search history.

(56) References Cited

U.S. PATENT DOCUMENTS

| | | | | |
|---|---|---|---|---|
| 4,814,041 | A | * | 3/1989 | Auda ............................ 438/712 |
| 5,072,287 | A | | 12/1991 | Nakagawa et al. |
| 2001/0023112 | A1 | * | 9/2001 | Leobandung ................. 438/423 |
| 2005/0212056 | A1 | | 9/2005 | Iwamatsu et al. |
| 2009/0085116 | A1 | | 4/2009 | Aoki |

FOREIGN PATENT DOCUMENTS

| | | |
|---|---|---|
| JP | 2007-258501 | 10/2007 |
| KR | 2003-0024215 | 3/2003 |

OTHER PUBLICATIONS

Chinese Office Action issued Oct. 21, 2011, in Patent Application No. 201010150500.5 (with English-language outline).
U.S. Appl. No. 13/355,036, filed Jan. 20, 2012, Aoki.

* cited by examiner

*Primary Examiner* — Matthew Landau
*Assistant Examiner* — Colleen E Snow
(74) *Attorney, Agent, or Firm* — Oblon, Spivak, McClelland, Maier & Neustadt, L.L.P.

(57) ABSTRACT

An integrated semiconductor device and method of manufacturing the same includes leaving one part of a semiconductor layer so that an inclined surface is formed on a trench when forming the trench on a SOI wafer. A thick silicon oxide film (second insulation film) is formed along this incline surface. This thick silicon oxide film prevents oxygen entering a boundary surface between an insulation layer and the semiconductor layer of the SOI wafer within the trench.

10 Claims, 7 Drawing Sheets

PRIOR ART

INTEGRATED SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2009-087.476 filed on Mar. 31, 2009, the entire contents of which is incorporated herein by reference.

BACKGROUND OF THE INVENTION

1. Field of the Invention

The present invention is related to an integrated semiconductor device having a trench for electrically separating a plurality of semiconductor elements, and a method of manufacturing the same.

2. Description of the Related Art

Forming a dielectrically isolated integrated circuit with an SOI (Silicon on Insulator) is known, for example, in Japanese Laid Open Patent 2007-258501 (Patent Document 1). When forming this type of integrated circuit, first, as is shown in FIG. 1, an SOI wafer comprised of a silicon substrate 1, a first insulation film 2 comprised from a silicon oxide film and a silicon semiconductor layer 3 is prepared. Following this, a trench (channel) 5 is formed by anisotropically etching (dry etching) the silicon semiconductor layer 3 using a resist mask 4. In this way, the silicon semiconductor layer 3 is separated into a plurality of component areas 6 by the trench 5. Because the trench 5 is formed to extend from the surface of the silicon semiconductor layer 3 to the first insulation film 2, the plurality of component areas 6 are mutually and electrically isolated by the first insulation film 2 and the trench 5.

The first insulation film 2 is exposed at the bottom of the trench 5 when the silicon semiconductor layer 3 is etched so that the trench 5 extends completely to the first insulation film 2. Conventionally, in order to ensure dielectric isolation between the plurality of component areas 6 by the trench 5, the etching process is performed sufficiently so that the silicon semiconductor layer 3 does not remain at the bottom of the trench 5. At the time of this etching process, because selectivity between the first insulation film 2 and the silicon semiconductor layer 3 is high and because the silicon semiconductor layer 3 is easily etched via the first insulation film 2, When etching reaches the first insulation film 2, etching progresses in a horizontal direction at the bottom of the trench 5, and the bottom surface of the silicon semiconductor layer 3 is cut away in a horizontal direction, that is, a notch 7 is produced.

In the state before a second insulation film (silicon oxide film) 8 is formed in the trench 5 shown in FIG. 1, characteristic degradation of the component areas 6 does not substantially occur. However, as is shown in FIG. 2, for example, when the second insulation film 8 comprised from a silicon oxide material is formed, oxygen is supplied to the notch 7 during the formation process of this second insulation film 8, and a silicon oxide film is also formed within this notch 7. Crystal defects are produced by the stress caused by the component areas 6 being raised by the silicon oxide film, causing degradation in the electrical characteristics of the components. Furthermore, in FIG. 2, phosphorus ions are implanted into the side wall of the trench 5 as n type impurities, and after this, the second insulation film 8 comprised from a silicon oxide material is formed by performing a high temperature thermal oxidation process on the silicon semiconductor layer 3. An n type semiconductor region 9 is then formed based on the phosphorus ions implanted within the component area 6.

When a V shaped cross section notch 7 is formed as is shown in FIG. 1 and FIG. 2, as well as the production of crystal defects in the component area 6, resistance decreases in the components due to thinning of the second insulation film 8 in part of the notch 7. In addition, an electrode formed from conductive poly-crystal silicon is buried within the trench 5 via the second insulation film 8 and a voltage is sometimes applied between this electrode and the component area 6. In this case, a leak current flows through the second insulation film 8 due to a concentration of an electrical field at the sharp angle part at the entrance of the notch 7. This decrease in the resistance of components and increase in leak current degrades the functions of the semiconductor device.

Therefore, the problems that the present invention attempts to solve is as follows: in a manufacturing method of an integrated semiconductor device where a trench for dielectrically isolation is formed on a wafer stacked with a substrate, insulation film and semiconductor layer, crystal degradation of a semiconductor layer is produced due to forming an insulation film within the trench. In addition, another problem the present invention attempts to solve is that in an integrated semiconductor device which has the above stated trench, a decrease in resistance and an increase in a leak current are produced at the bottom part of the trench.

SUMMARY OF THE INVENTION

In order to solve the problems stated above, a first characteristic related to an embodiment of the present invention is an integrated semiconductor device including a substrate, a first insulation film arranged on the substrate, a semiconductor layer arranged on the first insulation film and includes a plurality of semiconductor component areas separated by a trench, and a second insulation film formed in the trench, wherein each of the plurality of semiconductor component areas has a fringe part having a smaller thickness than an interval between a main surface of the semiconductor component areas and the first insulation film, and extending below the trench, and the second insulation film is formed on a wall surface of the trench and contacts with the first insulation film.

The integrated semiconductor device related to the first characteristic, wherein the second insulation film has a first part which covers a main side surface of the trench and a second part which covers the fringe part, and a maximum thickness of the second part is larger than a maximum thickness of the first part.

A second characteristic related to an embodiment of the present invention is a method of manufacturing an integrated semiconductor device, the method including in a wafer comprised of a substrate, a first insulation film arranged on the substrate, and a semiconductor layer arranged in the first insulation film, forming a trench on the semiconductor layer and extending from the main surface of the semiconductor layer towards the first insulation film in order to separate into a plurality of semiconductor component areas, so that a part which has a smaller thickness than a thickness of the semiconductor layer between a main surface of the semiconductor later and the first insulation film, remains between the first insulation film, and forming a second insulation film which covers a wall surface of the trench and contacts with the first insulation film, by oxidizing a part which is exposed on the trench of the semiconductor layer.

The method of manufacturing an integrated semiconductor device related to the second characteristic, wherein forming the second insulation film includes a process for introducing impurities with a first concentration along a main side surface of the trench from an entrance of the trench of the semiconductor layer to remaining part having a small thickness, and or introducing the impurities with a second concentration which is higher than the first concentration along the remaining part having the small thickness, and a process for forming the second insulation film by performing a heating process in an oxidation atmosphere on the semiconductor layer introduced with the impurities.

The method of manufacturing an integrated semiconductor device related to the second characteristic, wherein the process for introducing impurities to the semiconductor layer is a process for implanting impurity ions to a wall surface of the trench at a certain angle.

The method of manufacturing an integrated semiconductor device related to the second characteristic, wherein the process for forming the second insulation film by performing a heating process in an oxidation atmosphere on the semiconductor layer includes a process for performing a heat oxidation process of a first temperature on the semiconductor layer in which an oxidation velocity of a region introduced with impurities of the second concentration is made higher than an oxidation velocity of a region introduced with impurities of the first concentration, and forming a thicker oxide film than an oxide film on a region introduced with impurities of the first concentration, on a region introduced with impurities of the second concentration, and also includes a process for performing a heat oxidation process of a second temperature which is higher than the first temperature, on the semiconductor layer.

The method of manufacturing an integrated semiconductor device related to the second characteristic, wherein the process for forming the trench on the semiconductor layer includes a first process for forming a first trench with a depth from a main surface of the semiconductor layer to a point which does not reach the first insulation film, and a second process in which the semiconductor layer below the first trench is further removed and a second trench having a tapered end part which reaches the first insulation film is formed.

The method of manufacturing an integrated semiconductor device related to the second characteristic, wherein the process for forming the trench on the semiconductor layer is a process for forming a trench so that a remaining part of the semiconductor layer which has a thickness which can be changed to an oxide material in the process for forming the second insulation film, is produced between the bottom of the trench and the first insulation film The method of manufacturing an integrated semiconductor device related to the second characteristic, wherein the main side surface from the main surface of the semiconductor layer of the trench to a part of the semiconductor layer having a small thickness extends in an almost perpendicular direction to the main surface of the semiconductor layer.

The method of manufacturing an integrated semiconductor device related to the second characteristic, wherein the part of the semiconductor layer having a small thickness includes a surface which is inclined or curved.

A third characteristic related to an embodiment of the present invention is a method of manufacturing an integrated semiconductor device, the method including in a wafer comprised of a substrate, a first insulation film arranged on the substrate, and a semiconductor layer arranged in the first insulation film, forming a trench on the semiconductor layer from a surface of the semiconductor layer to the first insulation film in order to separate into a plurality of semiconductor component areas, forming a part introduced with impurities of a first concentration along a wall surface of a first part from an entrance of the trench of the semiconductor layer to a point in between, and a part introduced with impurities of a second concentration which is higher than the first concentration, along a wall surface of a second part between the first part and an end the trench, performing a heat oxidation process of a first temperature on the semiconductor layer in which an oxidation velocity of the second part introduced with impurities of the second concentration is made higher than an oxidation velocity of a first part introduced with impurities of the first concentration, and forming a thicker oxide film than an oxide film on a region introduced with impurities of the first concentration, on the second part introduced with impurities of the second concentration, and performing a heat oxidation process of a second temperature which is higher than the first temperature, on the semiconductor layer.

DETAILED DESCRIPTION OF THE INVENTION

Next, embodiments of the present invention will be explained while referring to FIG. 3 to FIG. 13.

First Embodiment

Figure 3:
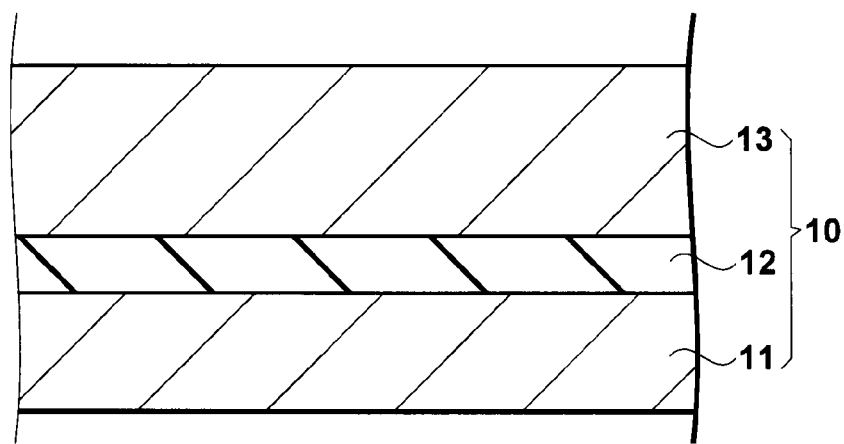
FIG. 3 is a cross-sectional diagram which shows an SOI wafer for manufacturing an integrated semiconductor device of first embodiment of the present invention.

The method of manufacturing the integrated semiconductor device according to embodiment one of the present invention is as follows. First, a SOI wafer 10 shown in FIG. 3 is prepared. The SOI wafer 10 of this embodiment is formed from a planar shaped silicon substrate 11 and a planar shaped n type silicon semiconductor layer which are stuck (bonded) together via a first insulation film or a first silicon oxide film 12 which can be called a buried insulation film. More specifically, the SOI wafer 10 is formed as follows. The first silicon oxide film 12 is formed using a thermal oxidation method is formed on at least one surface of the silicon substrate 11 and silicon semiconductor layer 13 and the silicon substrate 11 and silicon semiconductor layer 13 are joined using a heating process via the first the first silicon oxide film 12. Furthermore, it is preferred that the silicon semiconductor layer 13 which can also be called a device layer or a main semiconductor layer, be formed into a thin film by polishing after being attached to the silicon substrate 11. The silicon semiconductor later 13 is shown thicker than the substrate 11 in FIG. 3, however, it is possible to form the silicon semiconductor layer 13 thinner than the substrate 11.

In addition, it is possible to form the silicon semiconductor layer 13 by growing silicon on the first silicon oxide film 12 using an epitaxial growth method. Also, it is possible to form the substrate 11 and the silicon semiconductor layer 13 from semiconductor materials (for example, compound semiconductor) other than silicon. In addition, the first silicon oxide film 12 may be formed from an insulation material other than a silicon oxide material.

Figure 4:
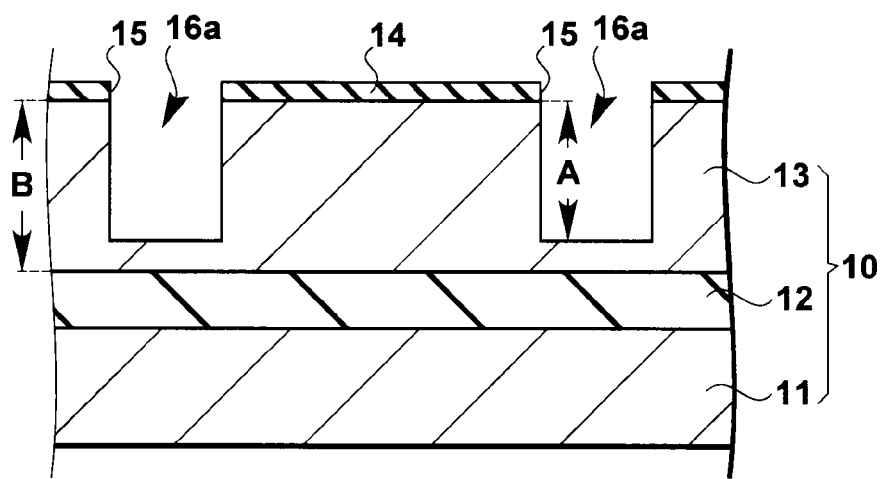
FIG. 4 is a cross-sectional diagram which shows a trench formed with a first depth on the SOI wafer of FIG. 1.

Next, a silicon oxide film with a thickness of about 500 nm is formed on the entire surface of the silicon semiconductor layer 13 shown in FIG. 3, and a mask 14 for the purposes of dry etching is formed by forming an opening 15 here as is shown in FIG. 4. The position of the opening 15 of this mask 14 corresponds to an isolation region of a plurality of components formed on the silicon semiconductor layer 13. Furthermore, the mask 14 can be formed using a material other than a silicon oxide material.

Next, anisotropic etching (for example, RIE: Reactive Ion Etching) using an etching gas with $SF_6$ for example as the component, is performed on the silicon semiconductor layer 13 through the opening 15 of the mask 14, and a shallow first trench 16a is formed with a first depth A. This first trench 16a extends in a perpendicular direction to the main surface of the silicon semiconductor 13. The first depth A of the shallow first trench 16a is smaller than a thickness B of the silicon semiconductor 13. Therefore, a part of the silicon semiconductor layer 13 remains between the bottom part of the shallow first trench 16a and the first silicon oxide film 12. The first depth A of the first trench 16a is determined so that the silicon semiconductor layer 13 remains on the bottom part of the first trench 16a even if there is variation in etching for forming the first trench 16a, and is preferably ½ to ¹⁄₅₀ of the thickness B of the silicon semiconductor layer 13.

Figure 5:
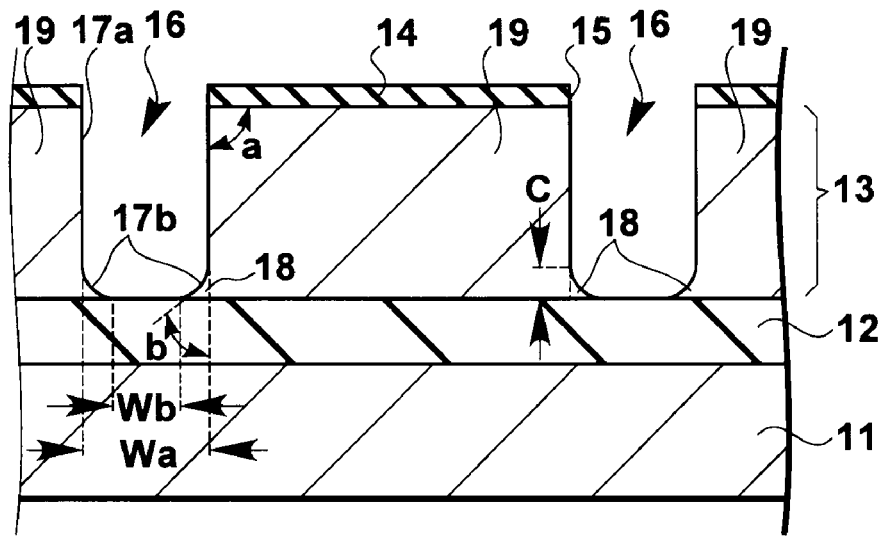
FIG. 5 is a cross-sectional diagram which shows a deeper trench of the SOI wafer in FIG. 4 forming an inclined surface.

Next, as is shown in FIG. 4, non-anisotropic etching is performed on the silicon semiconductor layer 13 between the bottom of the first trench 16a and the first silicon oxide film 12, and a second trench (below referred to simply as trench) 16 having a depth which reaches the first silicon oxide film 12, is formed as is shown in FIG. 5. This non-anisotropic etching reduces an etching rate by selecting one of a plurality of the following; reducing the power of reactive ion etching than when forming the trench 16a shown in FIG. 4, adjusting the level of a vacuum, or adding HBr to an etching gas when forming the first trench 16a to strengthen the production of a well know side wall protective film (an attachment having a function for preventing etching in a horizontal direction). When forming this trench 16, the silicon semiconductor layer 13 is separated into a plurality of component areas 19. In FIG. 5, a width Wb of the first silicon oxide film 12, which is exposed on the bottom part of the trench 16, is narrower than a width Wa of the entrance of the main surface side of the silicon semiconductor layer 13 in the trench 16. In other words, the trench 16 is formed to a taper from the main surface of the silicon semiconductor layer 13 towards the first silicon oxide film 12. Therefore, a fringe part 18 comprised from the component area 19 exists between the bottom part of the trench 16 and the first silicon oxide film 12. A main side surface 17a from the entrance of the trench 16 on the main surface of the silicon semiconductor layer 13 to the fringe part 18 preferably extends in a perpendicular direction or at a first angle a between 89° and 91° with respect to the main surface of the silicon semiconductor layer 13. An incline surface 17b of the fringe part 18 of the component area 19 at an end of the trench 16 has an angle b (preferably between 10° and 45°) with respect to the main surface 17a. Therefore, A second angle using the main surface of the silicon semiconductor layer 13 of the incline surface 17b of the fringe part 18 is (first angle a)+(angle b) and is larger than the first angle a.

As is shown in FIG. 5, in the present embodiment, the silicon oxide film 12 is exposed by the width Wb on the bottom of the trench 16. The exposed width Wb of the first silicon oxide film 12 is about half of the width Wa (Wa/2) at the main surface 17a of the trench 16. Furthermore, in this embodiment, the exposed width Wb of the first silicon oxide film 12 can be arbitrarily varied within a range of 0 to width Wa for example (preferably 0 to Wa/1.01). The fringe part 18 of the silicon semiconductor layer 13 has the incline surface 17b. Therefore, the thickness of the fringe part 18 becomes gradually smaller from the largest thickness C of a part which matches the main side surface 17a of the trench 16 towards the center of the trench 16. As a result, the notch 7 of the conventional silicon semiconductor layer 3 shown in FIG. 1 stated above is not produced in the silicon semiconductor layer 13 shown in FIG. 5. The largest thickness C of the fringe part 18 is smaller than an interval B (see FIG. 5) between the main surface of the silicon semiconductor layer 13 and the first silicon oxide film 12.

When the trench 16 is formed as is shown in FIG. 5, the silicon semiconductor layer 13 is physically and electrically separated in the plurality of component areas (semiconductor component areas, semiconductor element areas or device regions) 19. Semiconductor element such as a FET is formed in the plurality of component areas 19. Furthermore, semiconductor elements are formed within each component area 19 before forming the trench 16 and following this, the trench 16 can be formed.

Figure 8:
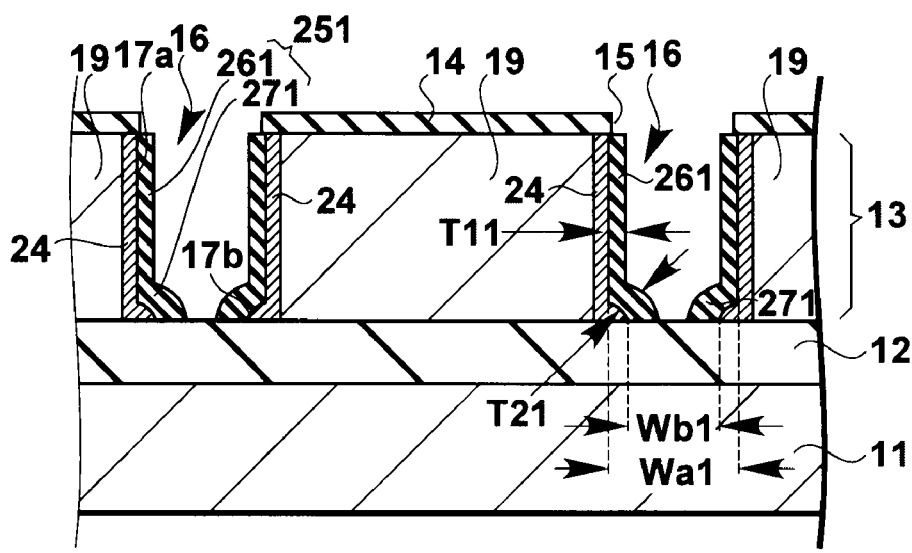
FIG. 8 is a cross-sectional diagram which shows forming a second insulation film by performing a thermal oxidation process at a higher temperature on the semiconductor device after the process in FIG. 7.
Figure 9:
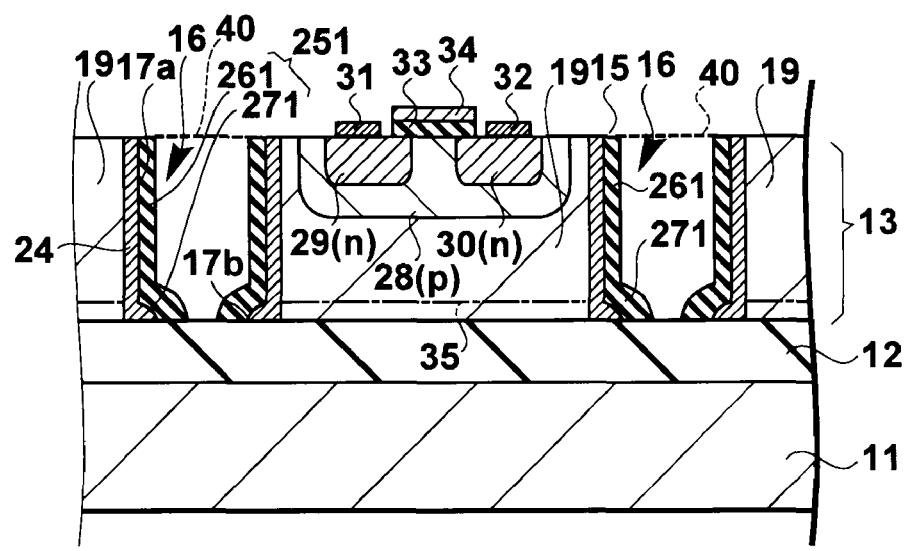
FIG. 9 is a cross-sectional diagram which shows a state where a semiconductor element is formed in the component area of FIG. 8.

Next, a silicon oxide film 251 of the wall surface of the trench 16 comprised of an n type diffusion layer (an n type semiconductor region) 24 and a silicon oxide film which acts as a second insulation film shown in FIG. 8 and FIG. 9. Furthermore, the silicon oxide film 251 is sometimes referred to as a trench oxide film in the explanation below. The n type diffusion layer 24 includes a concentration of n type impurities higher than an original concentration of n type impurities of the n type silicon semiconductor layer 13 in the surface of the component area 19, and has a function for preventing a depletion layer from spreading from the periphery of the component area 19, that is, the side wall of the trench 16, to the component area 19. In the present embodiment, the trench oxide film 251 is formed according to the present invention at the same time as forming the n type diffusion layer 24.

In order to obtain the n type diffusion later 24 and trench oxide film 251 shown in FIG. 8 and FIG. 9, first, a comparatively thin contamination prevention oxide film 20 of a few nm is formed on a wall surface of the trench 16. This contamination prevention oxide film 20 is formed from a silicon oxide film and has a function for preventing metal contamination of the component area 19 at the time of ion implantation. Furthermore, it is possible to omit the contamination prevention oxide film 20. In addition, it is also possible to form the contamination prevention oxide film 20 from a material other than a silicon oxide material.

Figure 6:
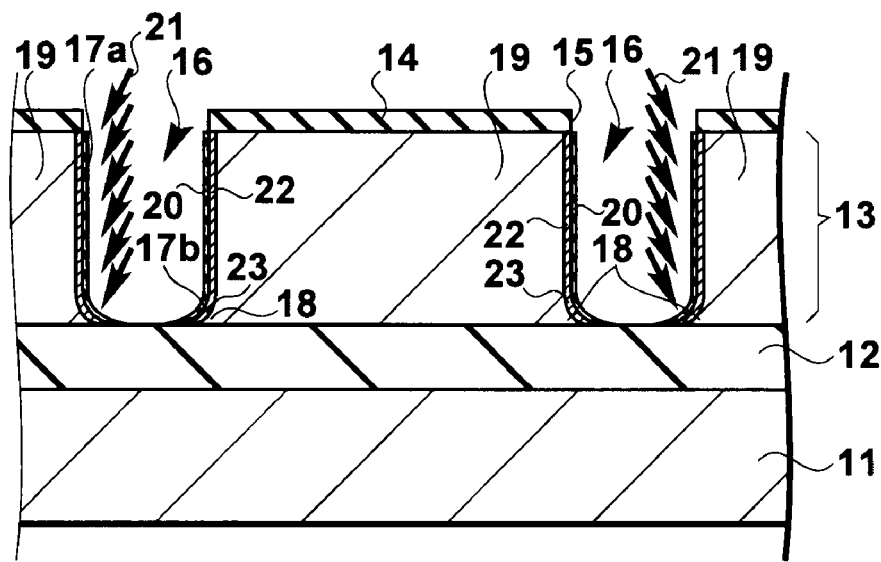
FIG. 6 is a cross-sectional diagram which shows forming a thin insulation film on a side wall of the trench in FIG. 4 and following this, a state in which phosphorus ions are implanted into a component area.

Next, as is shown by the arrow in FIG. 6, phosphorus ions (impurity ions) 21 are implanted into the component area 19 using an ion implantation method at a direction with an angle larger than 0° and smaller than 90° (preferably within a range of 1° and 15°) with respect to the main side surface 17a of the trench 16. The ion implantation conditions may be set at, for example, a dose amount of $1\times10^{15}$ atoms/cm$^2$ and an energy velocity of 40 keV. Implanting ions to the component area 19 through this contamination prevention oxide film 20 is performed with the same conditions to the entire periphery of the trench 16. Therefore, the irradiation angle of the phosphorus ions 21 to the incline surface 17b of the trench 16 is larger than the irradiation angle to the main side surface 17a. As a result, in the component area 19, a first region 22 with a small amount of phosphorus ions per unit area is formed along the main side surface 17a of the trench 16 which has a smaller irradiation angle of the phosphorus ions 21. At the same time, a second region 23 with a large amount of phosphorus ions per unit area is formed along the incline surface 17b of the trench 16 which has a large irradiation angle of the phosphorus ions 21. Furthermore, the width Wa of the trench 16 (see FIG. 5) is set for example, at 2000 nm and depth at 10000 nm so that ion implantation can be performed on the entire periphery of the trench 16.

Figure 7:
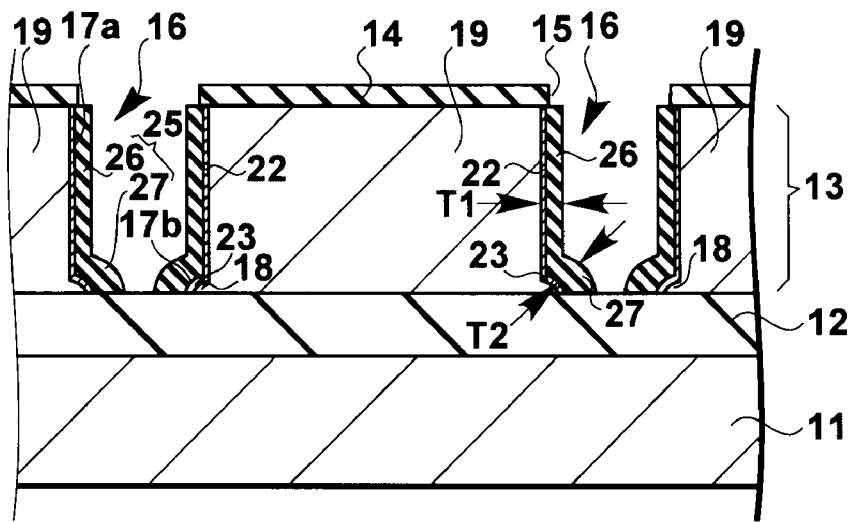
FIG. 7 is a cross-sectional diagram which shows forming an insulation film by performing a thermal oxidation process at a low temperature on the semiconductor device after the process in FIG. 6.

Next, the silicon semiconductor layer 13 is heated at a comparatively low first temperature of about 850° C. within an oxidation atmosphere a silicon oxide film 25 is formed on a wall surface of the trench 16 as is shown in FIG. 7. This silicon oxide film 25 is formed according to a known accelerated oxidation principle during a low temperature. More specifically, the silicon oxide film 25 is arranged with a comparatively thin first part 26 formed to a first thickness T1 (preferably 50 nm) along the main side wall 17a of the trench 16 and a second part 27 formed to a thickness T2 (preferably 60 nm or more) which is thicker than the first thickness T1 along the inclined surface 17b. The first temperature stated above, is set within a temperature range (preferably 700° C. to 900° C.) in the second region 23 which has a high concentration of impurities in which the accelerated oxidation is particularly generated.

Furthermore, in FIG. 7, the silicon oxide film 25 is shown in a stated which includes the contamination prevention film 12 shown in FIG. 6. In addition, the first thickness T1 is the thickness in a perpendicular direction to the surface of the first part 26 of the silicon oxide film 25 and the second thickness T2 is the thickness in a perpendicular direction or normal direction to the surface of the second part 27 of the silicon oxide film 25.

Next, in order to make dielectric isolation having high resistance characteristics possible, a heating process is performed on the silicon semiconductor layer 13 at a comparatively high second temperature (preferably 1000° C. to 1200° C., or more preferably 1200° C.) within an oxidation atmosphere and as is shown in FIG. 8, a comparatively thick trench oxide film 251 of about 800 nm is formed along the side wall of the trench 16. When a high temperature thermal oxide process is performed on the silicon semiconductor layer 13 in this way, a silicon oxide film grows while maintaining a low viscosity coefficient state, stress caused by the difference in a thermal expansion coefficient between the silicon oxide film and the silicon semiconductor layer 13 is reduced, and crystal defects are not generated as easily in the silicon semiconductor layer 13. A silicon oxide film also grows on the second part 27 of the silicon oxide film 25 as shown in FIG. 7 at the time of this high temperature heating process, however, the growth velocity is lower than for the first part 26. As is clear in FIG. 7, the second part 27, which has the comparatively thick second thickness T2, covers the boundary between the component area 19 and the first insulation film 12. Therefore, for example, in a process for performing a high temperature oxidation process of about 1200° C., oxygen entering the boundary between the component area 19 and the first silicon oxide film (insulation film) 12 is reduced by the second part 27 and a silicon oxide film is not formed on the boundary stated above. As a result, in the case of the first embodiment, because a silicon oxide film is not formed on the notch 7 created by the conventional method stated above shown in FIG. 7, the component area 6 is not raised and the problem whereby crystal defects are generated in the component area 6 is not created.

Further, in FIG. 7 and FIG. 8, one part of the silicon oxide film 25 and the trench oxide film 251 which covers the perpendicular main side surface 17a of the trench 16 becomes a first part 26, 261, and other part of the silicon oxide films 25 and the trench oxide film 251 which covers fringe part 18 becomes a second part 27, 271.

As is shown in FIG. 8, when the trench oxide film 251 is formed in a high temperature heating process, the phosphorus ions (impurities) implanted into the first region 22 and second region 23 shown in FIG. 6 and FIG. 7, diffuse into the component area 19 and the desired n type diffusion region 24 is formed.

Further, the shape of the component area 19 and the fringe part 18 shown in FIG. 5 are changed by forming the contamination prevention film 20 shown in FIG. 6 and the silicon oxide films 25 and the trench oxide film 251 shown in FIG. 7 and FIG. 8, however, for the purpose of explanation, the component area and the fringe part have the same reference symbols 19, 18 also in FIG. 7 and FIG. 8.

The size of the fringe part 18 in FIG. 7 and FIG. 8 is smaller than the size of the fringe part 18 shown in FIG. 5 due to performing heat oxidation for forming the silicon oxide films 25 and the trench oxide film 251, however, this fringe part 18 projects slightly to the side of the trench 16 than the perpendicular surface of the component area 19. Therefore, the width Wb1 of the part which is not covered by the component area 19 in which the first silicon oxide film 12 joins with the fringe part 18, is narrower than the width Wa1 between the main side surface of the trench 16, that is, the width between the component area 19.

Next, as is shown in FIG. 9, the desired semiconductor elements are formed within the component area 19. In the present embodiment, in order to obtain a FET (Filed Effect Transistor), a p type well 28 is formed within the n type component area 19, and an n type source region 29 and an n type drain region 30 are formed within the p type well 28. In addition, a source electrode 31 is formed above the n type source region 29, a drain electrode 32 is formed above the n type drain region 30, and a gate electrode 34 is formed via a gate insulation film 33 on the surface of the p type well 28 between the source region 29 and the drain region 30.

Furthermore, instead of the FET shown in FIG. 9, it is also possible to form other semiconductor elements such as a bipolar transistor and diode.

In addition, as is shown by the dotted line and the reference symbol 35 in FIG. 9, it is possible to form an n type semiconductor region at the bottom part of the component area 19 along the boundary of the first silicon oxide film 12 and the component area 19. This n type semiconductor region 35 is formed with a higher concentration of impurities than the n type component area 19.

In addition, as is shown by the broken line and the reference symbol 40 in FIG. 9, an electrode or an insulator comprised of conductive poly-crystal silicon can be filled into the trench 16 in which the trench oxide film 25 is formed.

It is possible to demonstrate the following effects in the integrated semiconductor device and method of manufacturing the same related to the present embodiment.

Figure 1:
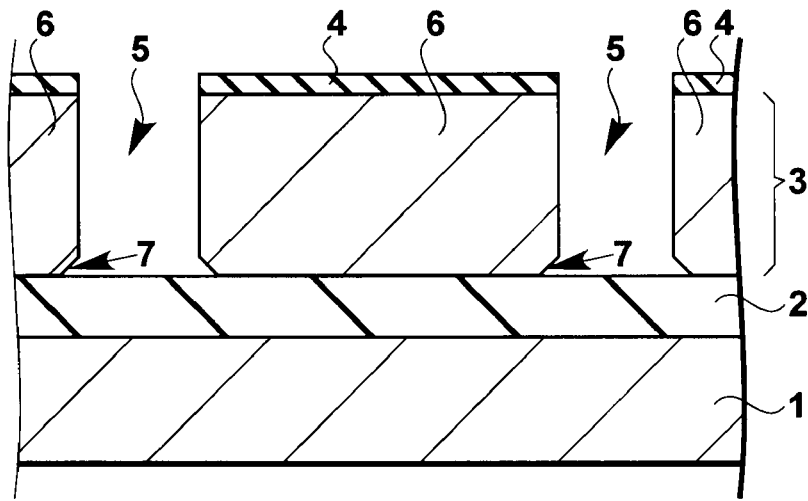
FIG. 1 is a cross-sectional diagram which shows a conventional semiconductor device with a trench having a notch.
Figure 2:
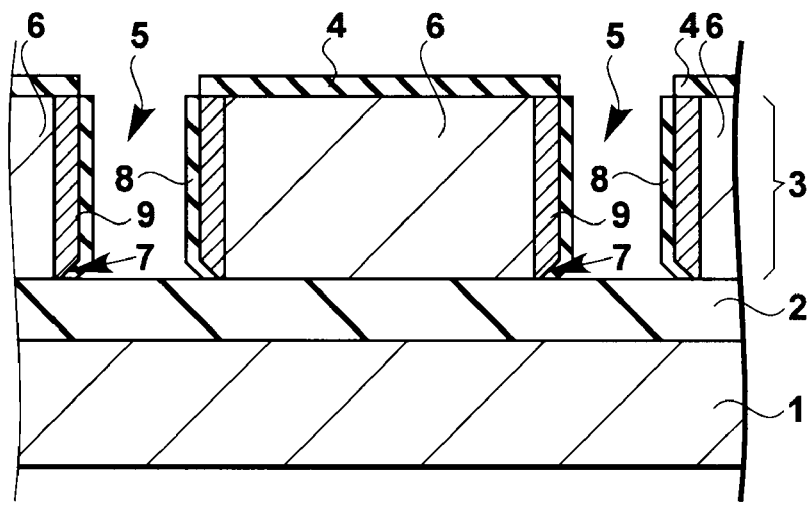
FIG. 2 is a cross-sectional diagram which shows a semiconductor device with an insulation film formed within the trench of FIG. 1.

(1) As is shown in FIG. 5, because a fringe part 18 having an incline surface 17b exists at the bottom of the trench 16, the previously stated notch 7 shown in FIG. 1 is not formed between the component area 19 and the silicon oxide film 12. In addition, at the time of the high temperature oxidation process for obtaining the trench oxide film (second insulation film) 251 shown in FIG. 8, the boundary between the component area 19 and the first silicon oxide film 12 is covered by the comparatively thick second part 27 of the trench oxide film (second insulation film) 25. Therefore, oxygen entering the boundary between the component area 19 and the first silicon oxide film 12 is reduced and formation of a silicon oxide film on this boundary is reduced. As a result, in the present embodiment, because the notch 7 is not formed in the component area 6 as is shown in FIG. 2 stated above, the silicon oxide film 8 is not formed on this notch 7 and crystal defects are not created in the component area 6 due to the component area 6 rising. Furthermore, the characteristics of the semiconductor elements formed in the component area 19 can be maintained to a high level.

(2) As is shown in FIG. 5, the incline surface 17b of the fringe part 18 is inclined with respect to the main side surface of the trench 16. As a result, when ions are implanted into the inclined surface 17b at the same angle as the angle of implanting ions into the main side surface 17a of the trench 16, it is possible to form the second region 23 with a high concentration of impurities near the incline surface 17b than near the main side surface 17a. In this way, utilizing the operation of the known accelerated oxidation in which the velocity of oxidation is high in a region with a high concentration of impurities, it is possible to easily form a second part 27 of a thick of the silicon oxide film 25 along the incline surface 17b. In other words, it is possible to form the second part 27 of the silicon oxide film 25 on the incline surface 17b of the fringe part 18 without performing a special process.

(3) An oxidation process with a comparatively low first temperature is performed, and a second part 27 of a thick of the silicon oxide film 25 is formed in advance on the incline surface 17b. Following this, a high temperature oxidation process with a comparatively high second temperature is performed, and because a final trench oxide film (second insulation film) 251 is formed as shown in FIG. 8, it is possible to reduce the generation of an oxide film on the boundary between the component area 19 and the silicon oxide film 12 during the high temperature oxidation process. Furthermore, when a high temperature oxidation process with a comparatively high second temperature is performed and the final trench oxide film (second insulation film) 251 is formed, the silicon oxide film grows while maintaining a low viscosity coefficient state, stress caused by the difference in the thermal expansion coefficient between the silicon oxide film and a silicon semiconductor layer 13 is reduced and it is possible to reduce crystal defects generated in the silicon semiconductor layer 13.

Furthermore, combining a process for forming a first region 22 with a low concentration of impurities stated above and a second region 23 with a high concentration of impurities and a process for forming a silicon oxide layer 25 by performing a heat oxidation process with a comparatively low first temperature and a heat oxidation process with a comparatively high second temperature is effective even when not forming a fringe part 18 in the component area 19. That is, by combining these processes, it is possible to easily and effectively form a thick silicon oxide film on the end part of the trench 16.

(4) Because the trench oxide film (second insulation film) 251 is formed using the same process as the process for forming the n type diffusion layer 24, it is possible to easily form the trench oxide film (second insulation film) 251 within the trench 16.

(5) As is shown by the broken line and reference symbol in FIG. 9, in the case of forming an integrated semiconductor device in which an electrode comprised of conductive polysilicon is buried within the trench 16 and a voltage is applied between this electrode and the component area 19, because a second part 27 of a thick of the trench oxide film 251 is formed at the bottom of the trench 16 in which the electrical field strength becomes higher, it is possible to reduce a leak current which flows in the second part 27 of the trench oxide film 251.

(6) Because the integrated semiconductor device of the present embodiment does not have a component equivalent to a sharp angle part based on a notch 7 created in a conventional example shown in FIG. 2, it is possible to reduce a concentration of an electrical field and improve resistance than in a conventional example.

Second Embodiments

The integrated semiconductor device and method of manufacturing the same related to the second embodiment of the present invention is as follows. This manufacturing method is explained using FIG. 10 to FIG. 12, however, because the same reference symbols are used for the same parts in FIG. 10 to FIG. 12 as in FIG. 3 to FIG. 9, some explanations are omitted.

Figure 10:
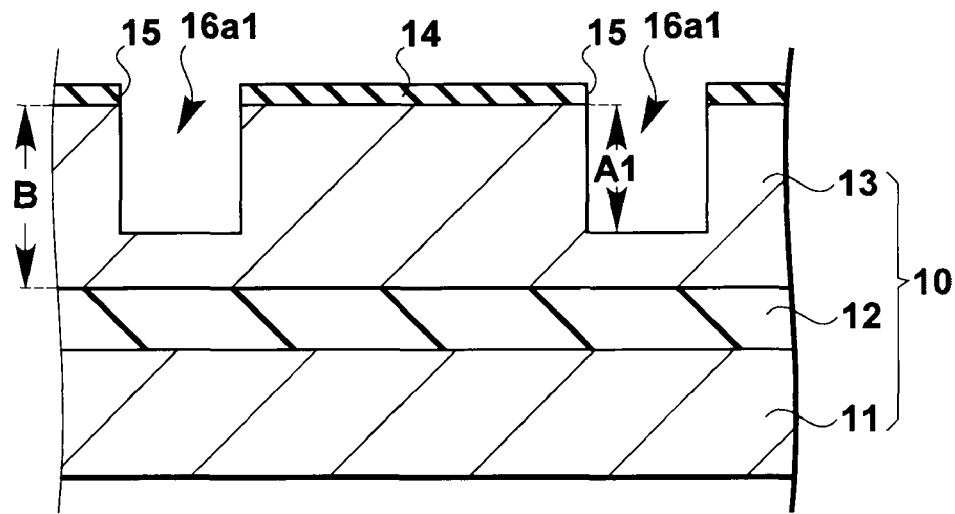
FIG. 10 is a cross-sectional diagram which shows a SOI wafer with a trench for manufacturing an integrated semiconductor device of second embodiment of the present invention.
Figure 11:
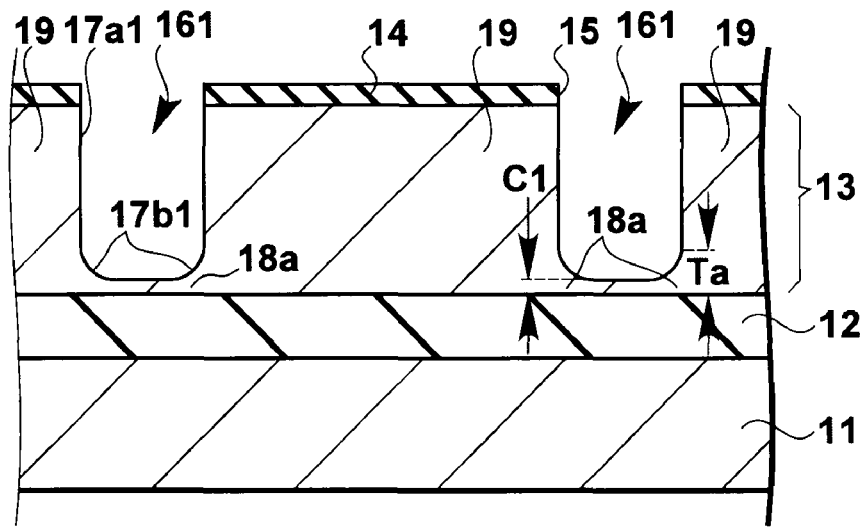
FIG. 11 is a cross-sectional diagram which shows the formation of a trench having an inclined surface by further deepening the trench in FIG. 10.

In the second embodiment, an SOI wafer 10 the same as the SOI wafer shown in FIG. 3 stated previously is prepared. Following this, as is shown in FIG. 10, a first trench 16a1 is formed on a semiconductor layer 13 using anisotropic gas etching. The depth of this trench 16a1 is shallower then the depth of the trench 16a shown in FIG. 4.

Next, the semiconductor layer 13 which remains at the bottom of the first trench 16a1 shown in FIG. 10 is etched further, and a second trench 161 having a U shaped inclined surface 17b1 at the bottom is formed. This second trench 161 includes a main side surface 17a1 almost perpendicular to a main surface of the silicon semiconductor layer 13 above the U shaped incline surface 17b1. It is possible to form the U shaped incline surface 17b1 of the second trench 161 using etching with no anisotropy or an etching with a weak anisotropy. In the embodiment shown in FIG. 11, there is a remaining part 18a of the semiconductor layer 13 having a thickness Ta at the bottom of the trench 161. A minimum thickness C1 of this remaining part 18a is set to dimensions by this part which can be oxidized by a later process.

Figure 12:
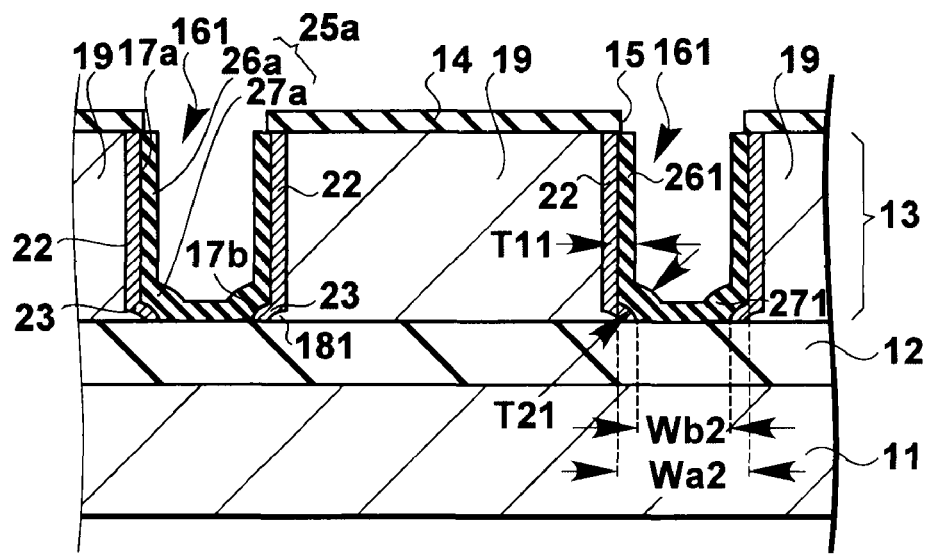
FIG. 12 is a cross-sectional diagram which shows the formation of an insulation film along a side wall of the trench in FIG. 11.

Next, the same as in embodiment one, after forming a component (not shown in the diagrams) equivalent to the contamination prevention film 20 shown in FIG. 6, phosphorus ions (impurity ions) are further implanted into the semiconductor layer 13 using ion implantation. A heating process with a first temperature (for example 850° C.) is performed in an oxide atmosphere is performed and a first part 26a having a first thickness T11 of a silicon oxide film (second insulation film) 25a is formed on the main side surface 17a1 of the trench 161 as is shown in FIG. 12, and a second part 27a having a second thickness T21 which is thicker than the thickness T11 is formed on the U shaped incline surface 17b1. By this heat oxidation, the part with a minimum thickness C1 of the remaining part 18a of the silicon semiconductor layer 13 below the trench 161 shown in FIG. 11, becomes completely oxidized and the silicon oxide film 25a becomes connected to the first silicon oxide film (insulation film) 12. In this way, the component area 19 is enclosed by the first silicon oxide film 12 and the second silicon oxide film 25a. The width Wb2 at the point where the second silicon oxide film 25a contacts with the first silicon oxide film 12 is narrower than the width Wa2 of the entrance of the trench 161. Therefore, the fringe part 181 of the component area 19 remains below the second part 27a of the second silicon oxide film 25a. This fringe part 181 includes an incline surface 17b2. Next, a heat process with a comparatively high second temperature (preferably 1200° C.) is performed on the silicon semiconductor layer 13 in an oxide atmosphere and an oxide film similar to the silicon oxide film 251 shown in FIG. 8 is formed.

Following this, the desired semiconductor elements (for example FET) are formed in the component area 19 the same as the semiconductor elements shown in FIG. 9.

In the integrated semiconductor device and method of manufacturing the same related to the second embodiment, the second part 27a of the silicon oxide film (second insulation film) 25a is formed on the entire bottom of the trench 161, however, because the basic structure of the integrated semiconductor device is the same as the first embodiment, it is possible to obtain the same effects as in the first embodiment.

Third Embodiments

Figure 13:
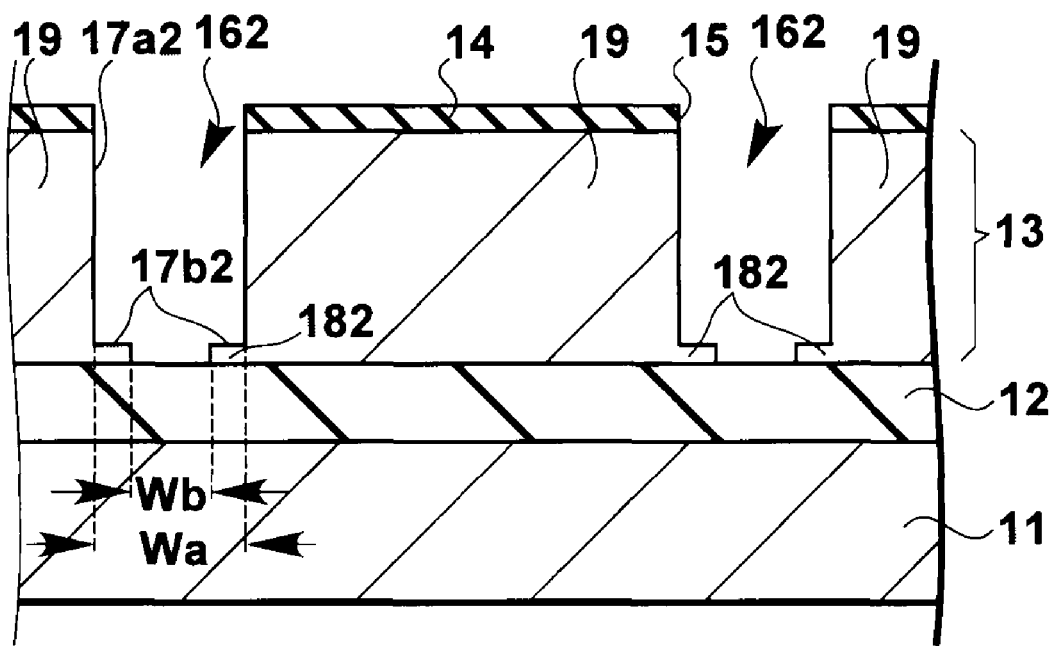
FIG. 13 is a cross-sectional diagram which shows an integrated semiconductor device of third embodiment in the same state as in FIG. 5.

The integrated semiconductor device and method of manufacturing the same related to the third embodiment of the present invention is as follows. This manufacturing method is explained using FIG. 13, however, because the same reference symbols are used for the same parts in FIG. 13 as in FIG. 3 to FIG. 9, some explanations are omitted. FIG. 13 is a process cross-sectional diagram which shows a manufacturing process corresponding to the manufacturing process shown in FIG. 5 in the first embodiment.

The integrated semiconductor device related to the third embodiment is formed with a fringe part 182 having a flat surface 17b2 as is shown in FIG. 13 instead of the fringe part 18 which has the incline surface 17b shown in FIG. 5 stated above. The structure and manufacturing processes other than this, are the same as for the integrated semiconductor device related to the first embodiment. The fringe part 182 is formed by accelerated oxidation as explained in the method of manufacturing the integrated semiconductor device related to the first embodiment.

As explained above, in the integrated semiconductor device and method of manufacturing the same related to the embodiments of the present invention, a notch is not generated in the bottom part of a component area in which semiconductor elements are formed. Therefore, a reduction in the characteristics of the semiconductor elements caused by the notch in the conventional technology explained using FIG. 1 and FIG. 2 is not created.

In addition, in the integrated semiconductor device and method of manufacturing the same related to the embodiments, it is possible to combine a process for introducing Impurities at a first concentration along the side wall of a first part from the entrance of the trench of the semiconductor layer to a point in between, and introducing impurities at a second concentration which is higher than the first concentration along a side wall of a second part between the first part and the end of the trench, performing a heat oxidation process at a first temperature on the semiconductor layer in which it is possible to make the oxidation velocity of the second part in which impurities are introduced at the second concentration larger than the oxidation velocity of the first part in which impurities are introduced at the first concentration, a process for forming a thicker oxide film than an oxide film on a first region in which impurities are introduced at the first concentration on the second part which is introduced with impurities at the second concentration, and a process for performing a heat oxidation process at a second temperature which is higher than the first temperature on the semiconductor layer. Therefore, because it is possible to easily form a comparatively thick oxide film on the second part, it is possible to obtain an integrated semiconductor device with a larger resistance and a smaller leak current.

Other Embodiments

The present invention is not limited to the embodiments stated above and can be transformed as in the following.

(1) It is possible to form a silicon oxide film 25a, a trench oxide film 251 and so on in a process for forming the n type diffusion region 24 and in other processes.

(2) It is possible to reverse the conduction of each region of the semiconductor elements as explained in the first to third embodiments.

(3) The process for forming the first region 22 with a low concentration of impurities and the second region 23 with a high concentration of impurities is a process for controlling the concentration of impurities by depending only the irradiation angle of phosphorus ions 21 shown by the arrow in FIG. 6 stated above. However, it is possible to control the concentration of impurities by controlling the amount of energy and length of implantation time during the ion implantation process.

(4) The silicon oxide films 25 and 25a shown in FIG. 7 and FIG. 12 may be formed without using accelerated oxidation.

(5) It is possible to use a semiconductor material or insulation material or metal material other than silicon in the substrate 11 of the wafer.

(6) It is possible to use an insulation material other then a silicon oxide material for the silicon oxide films (insulation films) 12, 25a and a trench oxide film 251.

(7) It is possible to form the end (bottom part) of the trench 16, 161 in a taper having a step shape.

(8) In the embodiments stated above, the trenches 16, 161 and 162 are formed so that the fringe parts 18, 181 and 182, are created in the component area 19. However, it is possible to form a trench so that the fringe parts 16, 161 and 162 are not created or so that a part the same as the notch 7 shown in FIG. 1 stated above. In this case, by appropriately changing the ion implantation conditions, the first region 22 which has a small amount of ion implantation (amount of impurities) the second region 23 which has a large amount of ion implantation are arranged on component area 19 the same as in the first embodiment, and by combining a heat oxide process by a comparatively low first temperature and a heat oxide process by a comparatively high second temperature, the second silicon oxide film (insulation film) is formed. In this way, by combining the heat oxide process by the first temperature and the heat oxide process by a comparatively high second temperature, it is possible to obtain the same effects as the effects obtained in the first embodiment.

Furthermore, it is possible to apply the present invention widely to semiconductor devices having an integrated structure which requires at least one of the following effects: a reduction of crystal defects, an improvement in resistance, or a reduction in a leak current.

What is claimed is:

1. A method of manufacturing an integrated semiconductor device, the method comprising;
    in a wafer comprised of a substrate, a first insulation film arranged on the substrate, and a semiconductor layer arranged on the first insulation film, forming a trench on the semiconductor layer and extending from a main surface of the semiconductor layer towards the first insulation film in order to separate into a plurality of semiconductor component areas, so that a part which has a smaller thickness than a thickness of the semiconductor layer between the main surface of the semiconductor layer and the first insulation film, remains between the first insulation film and the trench; and
    forming a second insulation film which covers a wall surface of the trench and contacts with the first insulation film, by oxidizing a part which is exposed on the trench of the semiconductor layer,
    wherein forming the second insulation film includes:
    a process for introducing impurities with a first concentration along a main side surface of the trench from an entrance of the trench of the semiconductor layer to the remaining part having a small thickness, and introducing the impurities with a second concentration which is higher than the first concentration along the remaining part having the small thickness; and
    a process for forming the second insulation film by performing a heating process in an oxidation atmosphere on the semiconductor layer introduced with the impurities, and
    an oxide film on the remaining part on the wall surface of the trench is formed thicker than an oxide film on other parts on the wall surface of the trench.

2. The method of manufacturing an integrated semiconductor device according to claim 1, wherein the process for introducing impurities to the semiconductor layer is a process for implanting impurity ions to the wall surface of the trench at a certain angle.

3. The method of manufacturing an integrated semiconductor device according to claim 1, wherein the process for forming the second insulation film by performing a heating process in an oxidation atmosphere on the semiconductor layer includes
    a process for performing a heat oxidation process of a first temperature on the semiconductor layer in which an oxidation velocity of a region introduced with impurities of the second concentration is made higher than an oxidation velocity of a region introduced with impurities of the first concentration, and forming a thicker oxide film than an oxide film on a region introduced with impurities of the first concentration, on a region introduced with impurities of the second concentration, and also includes
    a process for performing a heat oxidation process of a second temperature which is higher than the first temperature, on the semiconductor layer.

4. The method of manufacturing an integrated semiconductor device according to claim 1, wherein the process for forming the trench on the semiconductor layer includes a first process for forming a first trench with a depth from a main surface of the semiconductor layer to a point which does not reach the first insulation film, and a second process in which the semiconductor layer below the first trench is further removed and a second trench having a tapered end part which reaches the first insulation film is formed.

5. The method of manufacturing an integrated semiconductor device according to claim 1, wherein the process for forming the trench on the semiconductor layer is a process for forming a trench so that a remaining part of the semiconductor layer which has a thickness which can be changed to an oxide material in the process for forming the second insulation film, is produced between the bottom of the trench and the first insulation film.

6. The method of manufacturing an integrated semiconductor device according to claim 1, wherein the main side surface from the main surface of the semiconductor layer of the trench to a part of the semiconductor layer having a small thickness extends in an almost perpendicular direction to the main surface of the semiconductor layer.

7. The method of manufacturing an integrated semiconductor device according to claim 1, wherein the part of the semiconductor layer having a small thickness includes a surface which is inclined or curved.

8. A method of manufacturing an integrated semiconductor device, the method comprising;
    in a wafer comprised of a substrate, a first insulation film arranged on the substrate, and a semiconductor layer arranged in the first insulation film, forming a trench on the semiconductor layer from a surface of the semiconductor layer to the first insulation film in order to separate into a plurality of semiconductor component areas;
    forming a part introduced with impurities of a first concentration along a wall surface of a first part from an entrance of the trench of the semiconductor layer to a point in between, and a part introduced with impurities of a second concentration which is higher than the first concentration, along a wall surface of a second part between the first part and an end the trench;
    performing a heat oxidation process of a first temperature on the semiconductor layer in which an oxidation velocity of the second part introduced with impurities of the second concentration is made higher than an oxidation velocity of a first part introduced with impurities of the first concentration, and forming a thicker oxide film than an oxide film on a region introduced with impurities of the first concentration, on the second part introduced with impurities of the second concentration; and
    performing a heat oxidation process of a second temperature which is higher than the first temperature, on the semiconductor layer.

9. The method of manufacturing an integrated semiconductor device according to claim 8, wherein the process for introducing impurities of the first and the second concentration uses an ion implantation method of impurities.

10. A method of manufacturing an integrated semiconductor device, the method comprising;
    in a wafer comprised of a substrate, a first insulation film arranged on the substrate, and a semiconductor layer arranged on the first insulation film, forming a trench on the semiconductor layer and extending from the main surface of the semiconductor layer towards the first insulation film in order to separate into a plurality of semiconductor component areas, so that a part which has a smaller thickness than a thickness of the semiconductor layer between a main surface of the semiconductor layer and the first insulation film, remains between the first insulation film and the trench; and forming a second insulation film which covers a wall surface of the trench and contacts with the first insulation film, by oxidizing a part which is exposed on the trench of the semiconductor layer, wherein forming the second insulation film includes:

a process for introducing impurities with a first concentration along a main side surface of the trench from an entrance of the trench of the semiconductor layer to the remaining part having a small thickness, and introducing the impurities with a second concentration which is higher than the first concentration along the remaining part having the small thickness; and a process for forming the second insulation film by performing a heating process in an oxidation atmosphere on the semiconductor layer introduced with the impurities, the process for forming the second insulation film by performing the heating process including:

a process for performing a heat oxidation process of a first temperature on the semiconductor layer in which an oxidation velocity of a region introduced with impurities of the second concentration is made higher than an oxidation velocity of a region introduced with impurities of the first concentration and forming a thicker oxide film than an oxide film on a region introduced with impurities of the first concentration, on a region introduced with impurities of the second concentration; and a process for performing a heat oxidation process of a second temperature which is higher than the first temperature, on the semiconductor layer.

* * * * *